United States Patent [19]
Brown

[11] 4,196,419
[45] Apr. 1, 1980

[54] ANALOG TO DIGITAL CONVERTER

[75] Inventor: Kenneth R. Brown, Kirknewton, Scotland

[73] Assignee: Ferranti Limited, Hollinwood, England

[21] Appl. No.: 860,190

[22] Filed: Dec. 13, 1977

[51] Int. Cl.² ........................................... H03K 13/02
[52] U.S. Cl. ..................... 340/347 AD; 340/347 NT
[58] Field of Search .... 340/347 NT, 347 M, 347 AD; 324/115, 99 D; 325/38 B, 38 R

[56] References Cited
U.S. PATENT DOCUMENTS

| | | | |
|---|---|---|---|
| 3,267,458 | 8/1966 | Anderson | 340/347 NT |
| 3,516,085 | 6/1970 | Dano | 340/347 AD |
| 3,531,797 | 9/1970 | Pellegrini | 340/347 AD |
| 3,662,376 | 5/1972 | Furukawa | 340/347 NT |

FOREIGN PATENT DOCUMENTS 1154795 6/1969 United Kingdom ................ 340/347 M Primary Examiner—Charles D. Miller
Attorney, Agent, or Firm—Cameron, Kerkam, Sutton, Stowell & Stowell

[57] ABSTRACT

A circuit for digitizing data represented by a variable electric current includes a capacitor to which a variable direct current is applied, and a reference stage defining two voltage levels and producing a control signal when the voltage across the capacitor reaches one of the two levels. The control signal causes the charge on the capacitor to be changed by a known amount. The number of charge pulses is counted and added to the instantaneous value of the capacitor voltage.

3 Claims, 5 Drawing Figures

ANALOG TO DIGITAL CONVERTER

This invention relates to electric circuits, and in particular to such circuits for digitising data represented by a varying electric current.

Circuit arrangements are known by which data represented by a varying electric current may be digitised, and these are applicable to both alternating and direct currents. The limiting factor is the maximum rate of change of the current in relation to the sampling rate of the analogue-to-digital converter normally used. To avoid this limitation it is known to use the current to charge a capacitor, and to digitise the voltage across the capacitor in the normal way. In such circuits it is usually necessary to provide some means for discharging the capacitor at intervals, and this can lead to errors if very accurate digitising is required.

It is an object of the invention to provide an electric circuit for digitising data represented by an electric current to a high degree of accuracy.

According to the present invention there is provided an electric circuit for digitising data represented by a variable electric current, which circuit includes a capacitor to which may be applied a variable direct current proportional to the instantaneous value of a variable quantity, a reference stage operable to define upper and lower voltage levels and responsive to the voltage across the capacitor to deliver a first control signal whenever the said voltage reaches the upper voltage level and a second control signal whenever the said voltage reaches the lower voltage level, charging means responsive to either one of the first and second control signals to apply to the capacitor a pulse of known constant charge in such a sense that the voltage across the capacitor changes to a value near to the voltage level giving rise to the other control signal, counting means for counting the number and polarity of the charge pulses applied to the capacitor by the charging means, an analogue-to-digital converter operable to sample the voltage across the capacitor at a rate such that the time interval between successive samples is greater than the duration of a charge pulse, and summing means for combining the output of the counting means with the instantaneous output of the analogue-to-digital converter.

The charging means may comprise a current source operable to deliver a current of constant known amplitude and switching means responsive to the control signals to connect the output of the current source to the capacitor for a known period of time.

An embodiment of the invention will now be described, by way of example, with reference to the accompanying drawings, in which FIG. 1 is a block diagram of an electric circuit;

Figure 1:
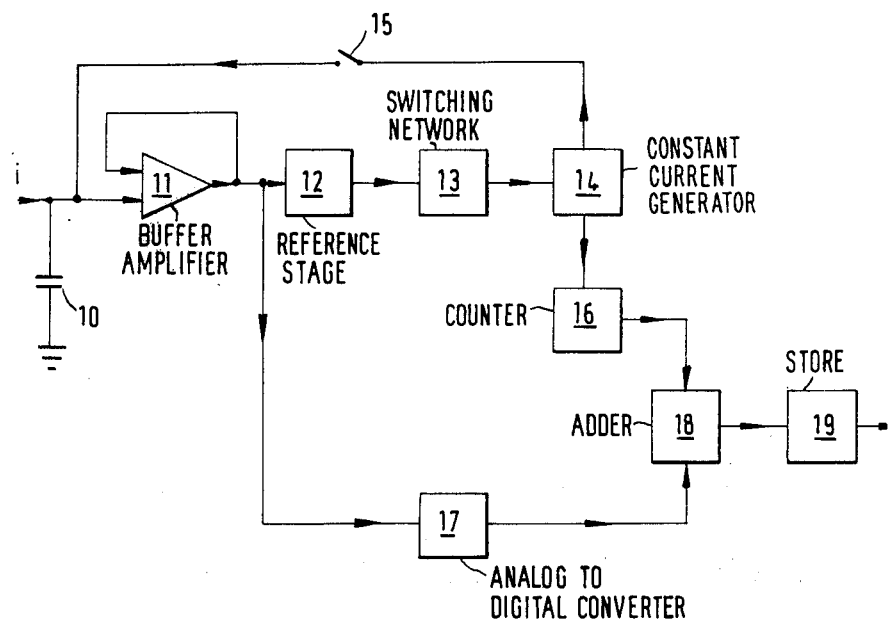

Referring now to FIG. 1, this shows a circuit suitable for deriving a digital representation of velocity from an analogue input representing acceleration.

The input to the circuit is a current i which is, at any instant, proportional to the value of the acceleration measured by an accelerometer. This current is applied to a capacitor 10 connected between the input and earth. Also connected to the capacitor is a high input impedance buffer amplifier 11. The output of the amplifier 11 is connected to a reference stage 12. This reference stage is arranged to define upper and lower voltage levels, and delivers an appropriate control signal whenever the voltage across the capacitor 10 exceeds either of these levels. The control signal indicates which voltage level has been reached. The output of the reference stage 12 is connected through a switching network 13 to a constant current generator 14, these last two making up the charging means of the invention. The output of the constant current generator 14 is connected through a switch 15 to the capacitor 10. A second output from the constant current generator 14, denoting the sense of each current output, is applied to a counter 16.

The ouput of amplifier 11 is also applied to an analogue-to-digital converter 17 which samples the output of the amplifier. Preferably this sampling occurs at a fixed rate such that the time between successive samples is greater than the duration of a charge pulse. In addition the sampling must be inhibited whilst a charge pulse is actually being applied. The contents of the counter 16 and the outputs of the analogue-to-digital converter 17 are added 18 by adder to give a digital output indicative of the total time integral of the input acceleration, that is an indication of velocity in the case of an inertial system. This is stored in a store 19 and, if desired, may be further integrated to give a measurement of distance travelled.

Figure 2:
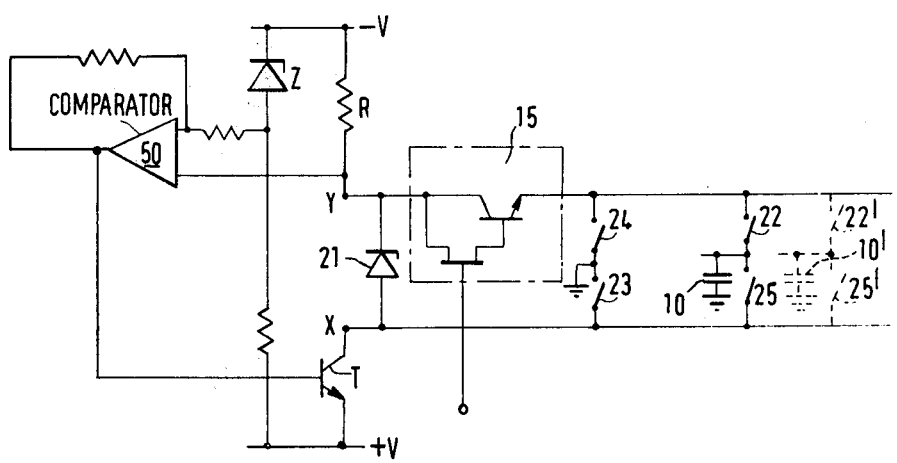
FIG. 2 shows detail of part of FIG. 1.

The switching network 13 and constant current generator 14 are shown in greater detail in FIG. 2.

Referring to FIG. 2 the constant current generator comprises an NPN transistor T having its emitter connected to a supply $-V$ and its collector forming one output terminal X of the constant current generator. The other terminal Y is connected by way of a resistor R to a supply $+V$. Also across the same supply is a reference potential divider comprising a zero reference diode Z and a resistor. The junction between the zener diode and the resistor is connected to the inverting input of an operational amplifier 50 operating as a comparator. The non-inverting input of the amplifier is connected to the terminal Y of the constant current generator. The comparator 50 has a negative feedback resistance connected between its output and its inverting input, and its output is connected to the base of the transistor T.

The remainder of FIG. 2 shows the switching network of FIG. 1. Switch 15 is provided by a transistor having its base current supplied by an FET for fast operation. Switch 15 is connected to one of the ouput terminals of the constant current generator, here shown as terminal Y, and pairs of switches 23 and 24, 22 and 25 are connected between switch 15 and the other terminal X as shown. The common point of switches 23 and 24 is connected to earth potential, whilst that of switches 22 and 25 is connected to the capacitor 10.

The switches 15 and 22 to 25 may be operated by a simple timing circuit responsive to the control signal provided by the reference stage 12. The first control signal causes the operation of one pair of switches 22 and 23 or switches 24 and 25. When the selected pair of switches has closed, switch 15 is closed for a fixed known period of time, and then opened. Finally the selected pair of switches also open. The presence of the other control signal has a similar effect, except that the other pair of switches is used.

The constant current generator operates in such a manner that the voltage drop across resistor R due to current flow through it is compared with the voltage across the zener diode Z by the comparator 50. Any difference results in a change in the output of the comparator and hence in the base current of transistor T. The circuit thus operated to maintain the current through resistor R at a constant value. The zener diode 21 is required to pass the constant current when switch 15 is open. The direction of current flow during charge transfer is always such as to move the capacitor voltage away from the voltage level which gave rise to the control signal and towards the other voltage level.

If apparatus with which the constant current generator just described is used has more than one capacitor charged by separate variable currents, then the single constant current generator may be time-shared between the various capacitors. FIG. 2 shows, in broken line, a second capacitor 10' and switches 22' and 25'. Switches 15, 23 and 24 are common.

Figure 3:
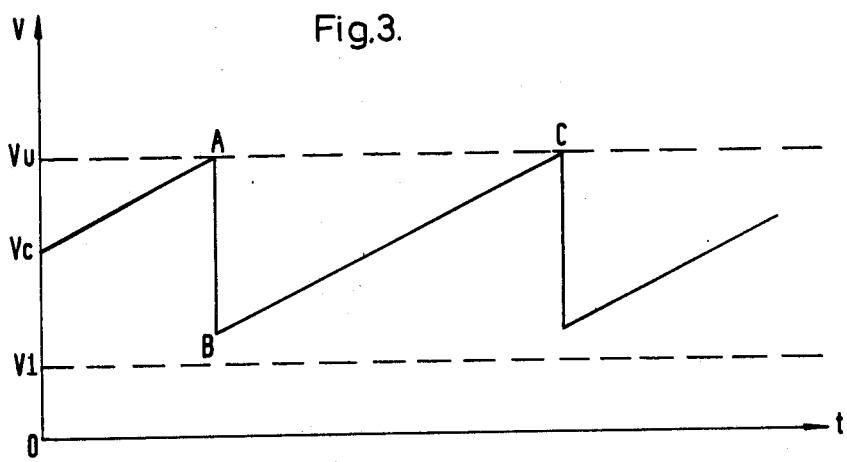
FIG. 3 illustrates the principle of operation of the invention.

Referring now to FIG. 3, this shows the voltage across the capacitor during the operation of the circuit described above. The upper voltage level Vu and the lower voltage level Vl, both fixed and defined by the reference stage, are shown as both being positive. The current applied to the capacitor is assumed to be constant. The voltage across the capacitor represents the time integral of the acceleration input.

Initially the voltage across the capacitor is at some value Vc. Due to the current i applied to the capacitor the voltage across it rises linearly until it reaches the upper voltage level Vu, at point A. At this time the reference stage produces a control signal indicating that the upper voltage level has been reached. This causes the switch 15 and the appropriate pair of switches 22 and 23 or 24 and 25 of the switching network to close for a known period of time. A known charge is transferred from the constant current generator to the capacitor, in such a sense as to reduce the voltage across the capacitor towards the lower level Vl. It is not necessary to reduce the capacitor voltage exactly to the level Vl, since the charge transferred is known from the duration and value of the constant current. The voltage across the capacitor thus falls to a value indicated at point B. The time taken for the transfer of charge is very small. If the applied current remains constant then the voltage across the capacitor has a waveform as shown in FIG. 3. Each time there is a transfer of charge to the capacitor, the constant current generator produces a signal pulse which is counted by the counter 16 of FIG. 1, the signal pulse also indicating the polarity of the charge transfer, and representing a coarse increment of the integral of the acceleration input.

The analogue-to-digital converter 17 of FIG. 1 is sampling the voltage across the capacitor at regular intervals, at a rate which is slower than the time taken to effect the charge transfer referred to above. The instantaneous output of the converter represents the fine increment of the integral of the acceleration input. Between the start of the waveform of FIG. 3 and point A the voltage across the capacitor may be measured directly. Between points B and C the true value of the voltage is that measured across the capacitor plus the voltage drop between points A and B. Hence at any time the true value of the voltage is that measured by the analogue-to-digital converter plus the sum of the voltage changes due to the total number of charge transfers, that is, the sum of all coarse increments plus the instantaneous fine increment of the integral of the acceleration input.

In practice the current applied to the capacitor will not be constant, and may in fact vary very rapidly both in sense and magnitude. If the sense of the current is such that the voltage across the capacitor falls to the lower voltage level Vl, then the charge transfer from the constant current generator is in such a sense as to increase the voltage across the capacitor by the same known amount towards the upper voltage limit Vu. Frequently the upper and lower voltage levels are disposed on either side of earth potential.

Figure 4:
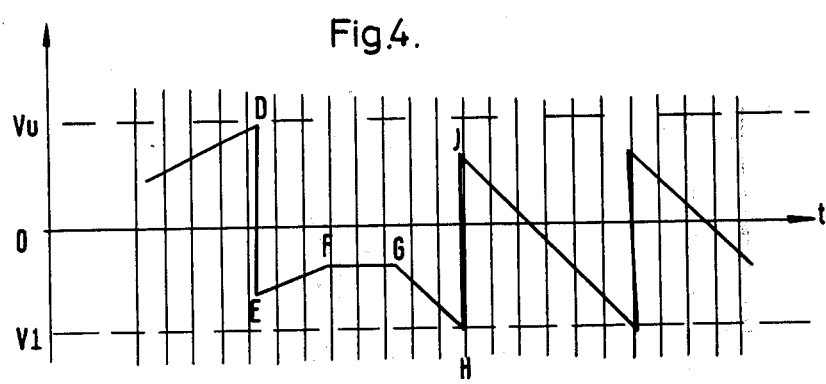
FIG. 4 illustrates the operation of the circuit of FIGS. 1 and 2.

FIG. 4 illustrates the operation of the circuit of FIG. 1 when the applied current varies both in sense and magnitude.

At some point the body to which the accelerometer is attached is assumed to be moving with constant acceleration. The current applied to the capacitor is therefore constant, and the capacitor charges in a linear manner. When the voltage across the capacitor reaches the upper voltage level Vu, at point D, a transfer of charge takes place as described above to reduce the voltage across the capacitor to that indicated at point E. The constant acceleration continues, and hence the capacitor voltage again rises, to point F at which time the acceleration is assumed to cease. The curve from F and G represents a period when the body is not subject to any acceleration at all. From point G the body is subjected to a constant deceleration, and hence the current flow is reversed and the capacitor voltage falls. At point H the voltage falls to the lower level Vl, and the capacitor is charged by a known charge transfer, raising the voltage to that of point J. So long as the deceleration continues the capacitor voltage repeatedly falls to the lower voltage level Vl.

The vertical lines indicate, purely by way of example, the times at which the capacitor voltage is sampled by the analogue-to-digital converter.

Figure 5:
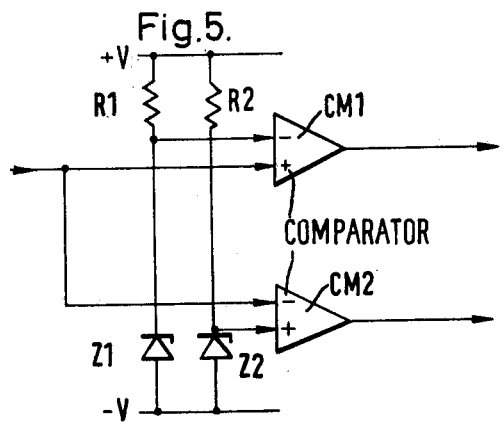
FIG. 5 shows one form of the reference stage.

FIG. 5 shows, in schematic form, a suitable circuit arrangement for the reference stage 12 of FIG. 1. As shown this comprises a pair of comparators CM1 and CM2 and a pair of potential dividers each comprising a resistor and a zener diode. The output of buffer amplifier 11 of FIG. 1 is connected to the non-inverting input of comparator CM1 whilst its inverting input is connected to the junction between a resistor R1 and a zener diode Z1 of the first potential divider. The output of buffer amplifier 11 is also connected to the inverting input of the second comparator CM2 which has its non-inverting input connected to the junction between a resistor R2 and a zener diode Z2 of the second potential divider. The two potential divider networks operate to determine the upper and lower voltage levels.

If the output buffer amplifier 11 is between the two threshold levels, then both comparators give a low level or negative output. When the buffer amplifier output rises to the upper voltage level, as determined by zener diode Z1, then the output of comparator CM1 rises to a positive value, this output being the first control signal. Similarly, if the output of the buffer amplifier 11 falls below the second voltage level, as determined by zener diode Z2, the output of comparator CM2 rises to a positive value, this output being the second control signal.

The analogue-to-digital converter 17 may be conveniently of the "successive approximation" type in which the analogue input is digitised and then compared with successive digital values stored in a register until a match is found. This form of converter makes it possible to replace the analogue reference stage of FIG. 5 with a digital arrangement. If this is done the reference stage 12 of FIG. 1 is removed, leaving the buffer amplifier output connected only to the converter 17. The converter may be gated to determine its relationship to the upper and lower voltage levels, now stored in digital form. The output of this gating network, indicating the sign of any difference between the buffer amplifier output and the two stored levels, forms the first and second control signals which are applied to the switching network 13 as before.

As already stated, the circuit gives as its output a digital representation of the instantaneous integral of acceleration of the body carrying the accelerometer. This may be integrated to give an indication of the distance covered by the body.

Although the example described above has acceleration as the variable quantity, other physical quantities may be applied, so long as they may be represented by an electric current.

Since the amount of charge transferred to the capacitor is known, the circuit described avoids the problems of known circuits which attempt to charge or discharge a capacitor to a specific voltage. The accuracy of the circuit described above is thus greater than that of the known circuits. Other circuits for producing pulses of constant charge may be used.

What I claim is:

1. An electric circuit for providing an output which is a digitised form of the continuous time integral of data represented by a variable electric current, which circuit includes a capacitor to which may be applied a variable direct current proportional to the instantaneous value of a variable quantity, a buffer amplifier having an input connected to the capacitor a reference stage connected to an output of the buffer amplifier operable to define upper and lower voltage levels and responsive to the voltage across the capacitor to deliver a first control signal whenever the said voltage reaches the upper voltage level and a second control signal whenever the said voltage reaches the lower voltage level, charging means responsive to either one of the first and second control signals to apply to the capacitor a pulse of known constant charge in such a sense that the voltage across the capacitor changes to a value near to the voltage level giving rise to the other control signal, counting means for counting the number and polarity of the charge pulses applied to the capacitor by the charging means, an analogue-to-digital converter connected to the output of the buffer amplifier operable to sample the voltage across the capacitor at a rate such that the time interval between successive samples is greater than the duration of a charge pulse, and an adder for combining the output of the counting means with the instantaneous output of the analogue-to-digital converter.

2. A circuit as claimed in claim 1 in which the charging means comprises a current source operable to deliver a current of constant known amplitude, and switching means responsive to the control signals to connect the output of the current source to the capacitor for a known period of time.

3. A circuit as claimed in claim 1 in which the variable quantity is acceleration, the output of the circuit being the time integral of that acceleration.

* * * * *

UNITED STATES PATENT AND TRADEMARK OFFICE
CERTIFICATE OF CORRECTION

PATENT NO. : 4,196,419
DATED : April 1, 1980
INVENTOR(S) : Kenneth Robson BROWN

It is certified that error appears in the above-identified patent and that said Letters Patent are hereby corrected as shown below:

[30] Foreign application Priority Data
December 18, 1976   Great Britain        52970/76.

Claim 1, Col. 6, line 3, after "capacitor" insert -- , --.

Signed and Sealed this

Twenty-fourth Day of June 1980

[SEAL]

Attest:

SIDNEY A. DIAMOND

*Attesting Officer*            *Commissioner of Patents and Trademarks*